United States Patent
Naito et al.

(10) Patent No.: US 9,165,696 B2
(45) Date of Patent: Oct. 20, 2015

(54) TRANSPARENT ELECTRODE LAMINATE

(71) Applicant: KABUSHIKI KAISHA TOSHIBA, Tokyo (JP)

(72) Inventors: Katsuyuki Naito, Tokyo (JP); Eishi Tsutsumi, Kawasaki (JP); Norihiro Yoshinaga, Kawasaki (JP); Yoshihiro Akasaka, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 270 days.

(21) Appl. No.: 13/621,997

(22) Filed: Sep. 18, 2012

(65) Prior Publication Data
US 2013/0078436 A1 Mar. 28, 2013

(30) Foreign Application Priority Data
Sep. 27, 2011 (JP) .................. 2011-211047

(51) Int. Cl.
*H01B 1/22* (2006.01)
*H05B 33/28* (2006.01)
(Continued)

(52) U.S. Cl.
CPC .................. *H01B 1/22* (2013.01); *H05B 33/28* (2013.01); *H01L 51/0023* (2013.01); *H01L 51/5206* (2013.01); *H01L 51/5215* (2013.01); *H01L 51/5234* (2013.01); *Y10T 428/2481* (2015.01)

(58) Field of Classification Search
CPC ........ B82Y 10/00; B82Y 30/00; B82Y 40/00; H01M 4/8605; H01M 2/1673; H01J 9/02; H01J 9/025; H01J 17/04; H01J 1/02; H01J 2211/225; H01J 2217/49207; H01L 33/42; H01L 31/022466; H01L 31/1884; H01L 51/5234

USPC ................ 349/84, 139; 174/126.2, 250, 257; 977/762, 890; 257/52, 57, 59, 72, 257/E33.064, E31.126; 428/221, 332
See application file for complete search history.

(56) References Cited

U.S. PATENT DOCUMENTS

2007/0212538 A1* 9/2007 Niu .............................. 428/367
2008/0143906 A1* 6/2008 Allemand et al. ............... 349/43
(Continued)

FOREIGN PATENT DOCUMENTS

| CN | 1599941 A | 3/2005 |
|---|---|---|
| CN | 101589473 A | 11/2009 |

(Continued)

OTHER PUBLICATIONS

U.S. Appl. No. 13/426,754, filed Mar. 22, 2012, Katsuyuki Naito.
(Continued)

*Primary Examiner* — Matthew Matzek
(74) *Attorney, Agent, or Firm* — Oblon, McClelland, Maier & Neustadt, L.L.P.

(57) ABSTRACT

According to one embodiment, the transparent electrode laminate includes a transparent substrate and an electrode layer which is formed on the transparent substrate and includes a three-dimensional network of metal nanowires. The electrode layer includes a first conductive region and a second conductive region adjacent to the first conductive region. Surfaces of the metal nanowires in the first conductive region are reacted to form reaction products. Surfaces of the metal nanowires in the second conductive region are unreacted. The second region has conductivity higher than that of the first conductive region and an optical transparency.

16 Claims, 3 Drawing Sheets

(51) Int. Cl.
*H01L 33/42* (2010.01)
*H01L 51/52* (2006.01)
*H01L 51/00* (2006.01)

(56) References Cited

U.S. PATENT DOCUMENTS

| | | |
|---|---|---|
| 2008/0259262 A1 | 10/2008 | Jones et al. |
| 2012/0070938 A1* | 3/2012 | Yang .............................. 438/98 |
| 2012/0098028 A1 | 4/2012 | Naito |

FOREIGN PATENT DOCUMENTS

| | | | |
|---|---|---|---|
| CN | 101689568 A | | 3/2010 |
| JP | 2010-507199 | | 3/2010 |
| JP | 2010-73322 | | 4/2010 |
| JP | 2010-525526 A | | 7/2010 |
| JP | 2010-287540 A | | 12/2010 |
| JP | 2011-70820 A | | 4/2011 |
| WO | WO 2008/046058 A2 | | 4/2008 |
| WO | WO 2008/131304 A1 | | 10/2008 |
| WO | WO 2011/097470 A2 | | 8/2011 |

OTHER PUBLICATIONS

Jose Luis Elechiguerra, et al., "Corrosion at the Nanoscale: The Case of Silver Nanowires and Nanoparticles", Chem. Mater. 2005, 17, 2005, 8 pages.

Japanese Office Action issued Apr. 1, 2014 in Patent Application No. 2011-211047 with English Translation.

Office Action issued Apr. 15, 2015 in Chinese Patent Application No. 201210410028.3 (with English translation).

Combined Chinese Office Action and Search Report issued Sep. 29, 2014 in Patent Application No. 201210410028.3 (with English language translation).

Office Action issued Jun. 30, 2015 in Japanese Patent Application No. 2014-179572 (with English translation).

Office Action mailed Aug. 21, 2015 in Chinese Application No. 201210410028.3 (w/English translation).

* cited by examiner

TRANSPARENT ELECTRODE LAMINATE

CROSS-REFERENCE TO RELATED APPLICATIONS

This application is based upon and claims the benefit of priority from Japanese Patent Application No. 2011-211047, filed Sep. 27, 2011, the entire contents of which are incorporated herein by reference.

FIELD

Embodiments described herein relate generally to a transparent electrode laminate and a method for manufacturing thereof.

BACKGROUND

When a transparent electrode such as ITO is applied to a device, patterning is needed. Since a transparent electrode formed of ITO with high conductivity has a large film thickness, a difference in height generated by etching becomes large. In a device in which an ultra thin film having a thickness of about 10 to several 10 nm is laminated, such as an organic solar cell or an organic EL device, defects such as short circuits at end portions are easily caused.

A transparent electrode formed by using metal nanowires such as silver nanowires has been recently suggested. A thickness of 100 nm or more is necessary to ensure a desired surface resistance in the transparent electrode formed by using metal nanowires. When the transparent electrode formed by using metal nanowires is patterned by etching, a large difference in height is caused similarly to the case of ITO. This leads to defects when an ultra thin film device is produced.

DETAILED DESCRIPTION

In general, according to one embodiment, a transparent electrode laminate includes a transparent substrate and an electrode layer which is formed on the transparent substrate and includes a three-dimensional network of metal nanowires. The electrode layer includes a first conductive region and a second conductive region adjacent to the first conductive region. Surfaces of the metal nanowires in the first conductive region are reacted to form reaction products. Surfaces of the metal nanowires in the second conductive region are unreacted. The second region has conductivity higher than that of the first conductive region and an optical transparency.

Hereinafter, embodiments will be described with reference to the drawings.

Figure 1:
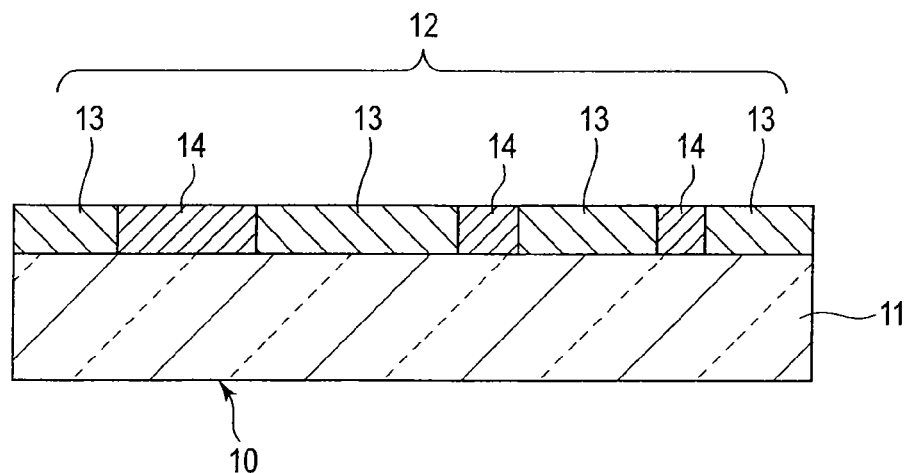
FIG. 1 is a schematic view showing a cross-sectional structure of a transparent electrode laminate according to one embodiment.

In a transparent electrode laminate 10 shown in FIG. 1, a patterned electrode layer 12 is formed on a transparent substrate 11. The electrode layer 12 has two conductive regions of a first conductive region 14 and a second conductive region 13 and the two regions are different in conductivity.

Figure 2:
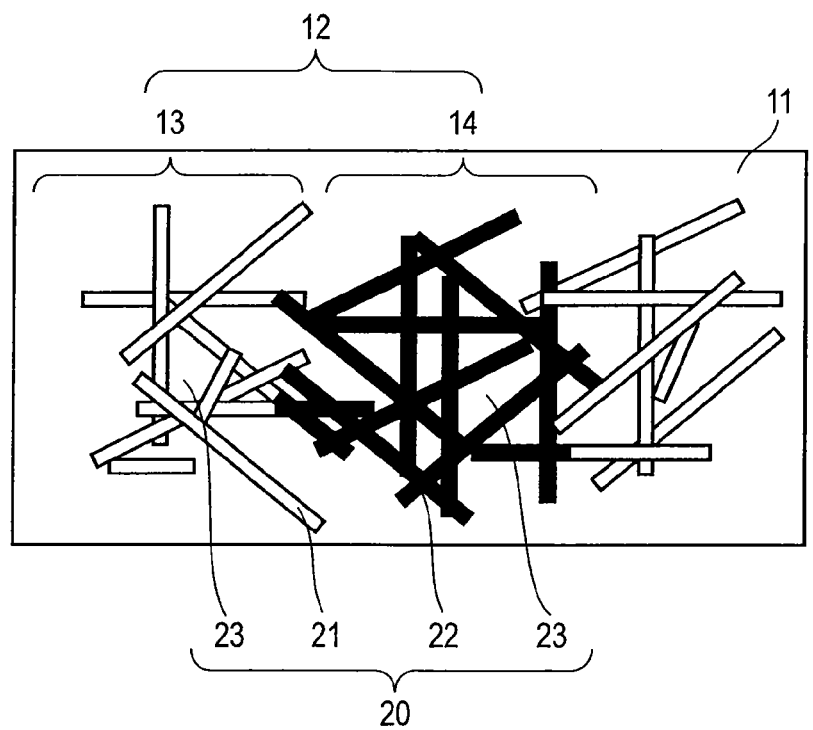
FIG. 2 is a pattern diagram of an electrode layer of a transparent electrode laminate according to one embodiment.

FIG. 2 shows a pattern diagram in which the electrode layer 12 is seen from the upper surface. The electrode layer 12 on the transparent substrate 11 includes a three-dimensional network 20 of metal nanowires as shown in the pattern diagram of FIG. 2. Gaps 23 in which metal nanowires are not present are present in the three-dimensional network 20. The gaps 23 pierce into the electrode layer 12 in the thickness direction.

Reaction products are formed on at least the surfaces of metal nanowires 22 in the first conductive region 14. The reaction products are formed on a part of the surfaces of the metal nanowires by reacting a part of the metal on the surfaces of the metal nanowires and the formation method thereof will be described below. On the other hand, metal on the surfaces of metal nanowires 21 in the second conductive region 13 is unreacted. In the second conductive region 13, the surfaces of all the metal nanowires are not always required to be in a complete metallic state. When 90% or more of the surfaces of the metal nanowires are unreacted, this is referred to as "unreacted" in the present specification. The reaction state of the surfaces of the metal nanowires can be confirmed by, for example, transmission spectra.

When the metal of the surfaces of metal nanowires is reacted to produce reaction products, the electric resistance is increased and the conductivity is reduced. Thus, the first conductive region 14 has a conductivity lower than that of the second conductive region 13. When the reaction products are present on the surface, the luster of metal nanowires is reduced and the light scattering is reduced.

In general, the specific gravity of the reaction products of metal is lower than that of unreacted metal. When the surfaces of metal nanowires are reacted to produce reaction products, the volume is increased, resulting in an increase in the film thickness. In this embodiment, the metal nanowires constitute the three-dimensional network 20, and include the gaps 23 in which the metal nanowires 21 and 22 are not present. An increase in the volume due to the reaction products is absorbed in the gaps. Thus, even if the surfaces of the metal nanowires in a predetermined region in the three-dimensional network 20 are reacted and the volume is increased, an increase in the film thickness can be suppressed.

The diameter of the metal nanowires constituting the three-dimensional network 20 is preferably from 20 nm to 200 nm. The diameter of the metal nanowires can be determined with a scanning electron microscope (SEM) or an atomic force microscope (AFM). The thickness of the electrode layer 12 can be suitably selected depending on the diameter of metal nanowires. Generally, it is from about 30 to 300 nm.

The material of the metal nanowires 21 can be selected from silver and copper. Silver and copper have an electric resistance as low as $2 \times 10^{-8}$ Ωm or less and are relatively chemically stable, and thus they are preferably used in this embodiment. When the metal nanowires contain at least 80% by mass of silver, a silver alloy containing palladium, indium, gold, bismuth, copper or the like can be used. When the metal nanowires contain at least 80% by mass of copper, a copper alloy containing gold, silver, zinc, nickel, aluminium or the like can be used.

As shown in FIG. 2, in the electrode layer 12, the three-dimensional network 20 is formed by contacting the metal nanowires with one another and is three-dimensionally continued. Two regions having different conductivities are present in the electrode layer 12. In the metal nanowires 22 in the first conductive region 14, at least metal on the surfaces is reacted to form reaction products. The reaction products reduce the conductivity and decrease the light scattering. When the metal nanowires are silver nanowires, the reaction products are preferably sulfides, oxides or halides. The halide is not particularly limited and a chloride is preferred because inexpensive hydrochloric acid can be used as a reaction raw material. These reaction products may be mixtures. Taking into consideration the stability, the reaction products are most preferably silver sulfide. When the metal nanowires are copper nanowires, the reaction products may be oxides, halides or a mixture thereof.

In the second conductive region 13 of the electric layer 12, the metal nanowires 21 have unreacted surfaces and exhibit high conductivity. Additionally, in the second conductive region 13, light can be transmitted to the gaps 23 in which the metal nanowires 21 are not present. Thus, the conductivity and optical transparency are ensured in the second conductive region 13 of the electrode layer 12 of the transparent electrode laminate 10 of this embodiment.

It is preferable that the second conductive region 13 is adjacent to the first conductive region 14 via a buffer zone which has characteristics between the two regions. The presence of the buffer zone allows precipitous changes in the film thickness to be reduced even if reaction products are formed on the surfaces of the metal nanowires in the first conductive region. The amount of the reaction products formed on the surfaces of the metal nanowires included in the buffer zone is lower than that of the first conductive region. This can be confirmed by surface observation with a scanning electron microscope (SEM) and an atomic force microscope (AFM).

As the material of the transparent substrate 11 to support the electrode layer 12, an inorganic material such as glass, an organic material such as polymethylmethacrylate (PMMA), and the like can be used. The thickness of the transparent substrate 11 can be suitably selected depending on the material and the application of the transparent electrode laminate. For example, in the case of a glass substrate, the thickness can be set to about 0.1 to 5 mm. In the case of a PMMA substrate, the thickness can be set to about 0.1 to 10 mm.

In the transparent electrode laminate 10 of this embodiment, it is preferable that a carbon layer containing graphene is formed at least one of the surfaces of the electrode layer 12. In other words, the carbon layer containing graphene may be laminated on at least one of the sides of the three-dimensional network 20 of the metal nanowires. The graphene may be a single- or multi-layer. As shown in FIG. 2, the gaps 23 are present in the three-dimensional network 20 of the metal nanowires. The gaps 23 contribute to the transparency of the second conductive region 13 in the electrode layer 12, but charge exchanges are not performed in the gaps 23. When the carbon layer containing graphene is laminated on the three-dimensional network of metal nanowires, charge exchanges via the carbon layer can be uniformly performed on the whole second conductive region 13 of the electrode layer 12.

When the carbon layer containing graphene is formed on the three-dimensional network of metal nanowires, the surface flatness can be improved. For example, as for the surface in which a single-layered graphene is formed, the irregularity to be measured with an atomic force microscope (AFM) is about 10 nm or less. In terms of advantages such as charge injection and lamination of an ultra thin film, such a transparent electrode laminate is suitable for, for example, organic EL devices and solar batteries.

In this regard, when the transparent electrode laminate of this embodiment is used as a cathode of the device, it is preferable that a part of the carbon in graphene is substituted with nitrogen. The doping amount (N/C atomic ratio) can be determined based on, for example, an X-ray photoelectron spectroscopy (XPS). The graphene having a doping amount (N/C atomic ratio) of about 1/200 to 1/10 has a work function lower than that of the graphene which is not nitrogen-substituted. Since it is easy to pick up electrons from a functional layer to be connected and to yield electrons to the functional layer, the performance as a cathode is improved.

The electrode layer in the transparent electrode laminate of one embodiment can be formed on a transparent substrate using, for example, a dispersion liquid containing metal nanowires. When a quartz substrate is used as the transparent substrate, it is desirable to perform a hydrophilization treatment on the surface on which a coating film is formed. The hydrophilization treatment can be performed by, for example, a nitrogen plasma treatment. Specifically, the nitrogen plasma treatment can be performed by leaving the substrate in a nitrogen plasma (0.1 millibar) for about 10 minutes using a magnetron sputtering device (13.56 MHz, 150 W). When the surface hydrophilicity of the quartz substrate on which the coating film is formed is improved, the uniformity of the film becomes better. The surface of the quartz substrate may be treated with 3-aminoethyl triethoxysilane to strengthen the bonding of metal nanowires to the substrate.

In order to stably disperse the metal nanowires in a dispersion medium, the diameter of the metal nanowires is preferably 200 nm or less. When the diameter of the metal nanowires is larger than 200 nm, the dispersibility to the dispersion medium is reduced. Thus, it becomes difficult to form a uniform coating film.

On the other hand, when the diameter of metal nanowires is too small, the length of the wires tends to be short, which results in an increase in the surface resistance of a coating film. When the diameter of the metal nanowires is 20 nm or more, a desired length is ensured. The diameter of the metal nanowires is more preferably from 60 nm to 150 nm.

The average length of the metal nanowires can be appropriately determined taking into consideration the conductivity and transparency of an electrode to be obtained. Specifically, the average length is preferably 1 µm or more from the viewpoint of conductivity. In order to avoid a decrease in the transparency due to aggregation, the average length is preferably 100 µm or less. An optimal length is determined depending on the diameter of the metal nanowires, and a ratio of the length and diameter (length/diameter) of the metal nanowires can be set to, for example, about 100 to 1000.

Silver nanowires having a predetermined diameter can be obtained from, for example, Seashell Technology. Alternatively, the silver nanowires having a predetermined diameter may be produced based on the literature review "Liangbing Hu et al., ACS Nano, Vol. 4, No. 5, p. 2955 (2010)". Copper nanowires having a predetermined diameter may be produced based on, for example, JP 2004-263318 (KOKAI) or JP 2002-266007 (KOKAI). However, the nanowires are not limited to these nanowires as long as the metal nanowires to be used in the embodiment are obtained.

The dispersion medium for dispersing metal nanowires is not particularly limited as long as it does not oxidize metal and can be easily removed by drying. For example, methanol, ethanol, isopropanol, and the like can be used. The concentration of metal nanowires in the dispersion liquid is not particularly specified, and it may be appropriately set within a range which ensures a good dispersion state.

Figure 3A:
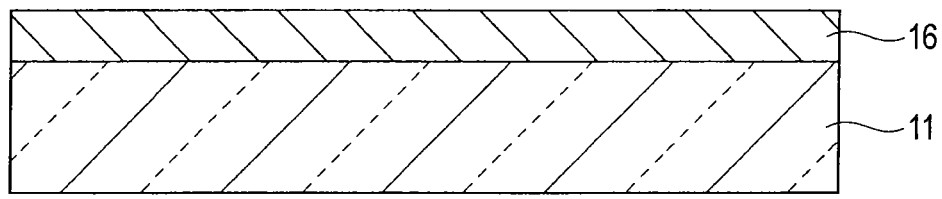
FIGS. 3A, 3B and 3C are cross-sectional views showing processes of a method for manufacturing a transparent electrode laminate according to one embodiment.

The dispersion liquid containing metal nanowires is applied to the surface of the transparent substrate by, for example, spin-coating, bar-coat printing, ink-jet printing or the like to form a coating film. The dispersion medium is removed by drying, for example, in a nitrogen or argon flow at about 50 to 100° C. for about 0.5 to 2 hours and a three-dimensional network 16 of metal nanowires is formed on the transparent substrate 11 as shown in FIG. 3A. A three-dimensional network having a desired thickness can be formed by repeatedly performing a process of applying the dispersion liquid and drying the dispersion medium.

Figure 3B:
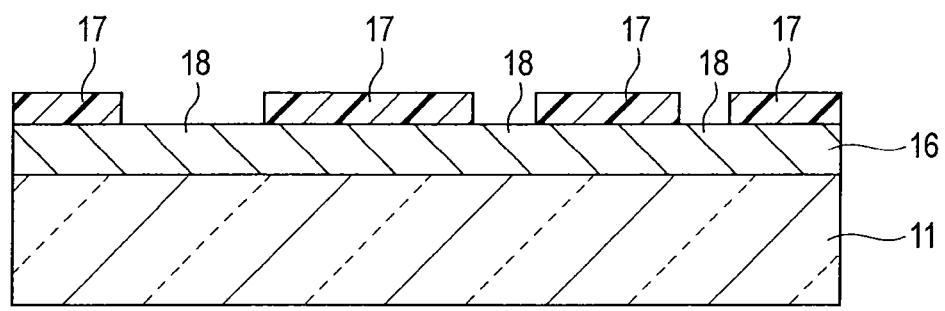

As shown in FIG. 3B, a protective film 17 is formed in a predetermined region on the three-dimensional network 16 of metal nanowires. The region on the three-dimensional network 16 in which the protective film 17 is formed corresponds to the second conductive region 13 in the electrode layer 12 of the transparent electrode laminate 10 shown in FIG. 1. The protective film 17 can be formed, for example, by pattern-printing a protective film solution. As the protective film solution, for example, about 5 to 10% by mass of a solution obtained by dissolving a protective film material in a solvent can be used. An example of the protective film material includes polymethylmethacrylate (PMMA) and an example of the solvent includes ethyl acetate.

For example, when the protective film solution is applied to the three-dimensional network 16 by screen printing using a predetermined screen and the solvent is removed, the protective film 17 formed of a cured layer of a protective film material is formed in a predetermined region on the three-dimensional network 16. Ethyl acetate as a solvent can be removed, for example, by heating. When the protective film is formed by screen printing, it can be simply formed.

Alternatively, the protective film may be formed by photolithography using a positive photosensitive resist. An example of the positive photosensitive resist includes a positive photoresist for spin coating (manufactured by AZ Electronic Materials Ltd.). The positive photosensitive resist is applied to the three-dimensional network in an ordinary manner to form a resist layer. An exposed portion of the resist layer is cross-linked by performing pattern exposure. An unexposed portion is dissolved with a developer and removed to form the protective film 17 formed of a cured layer of a positive photosensitive resist. When photolithography is employed, the size and interval of the protective film can be arbitrarily changed by selecting the exposure mask to be used for pattern exposure.

Figure 3C:
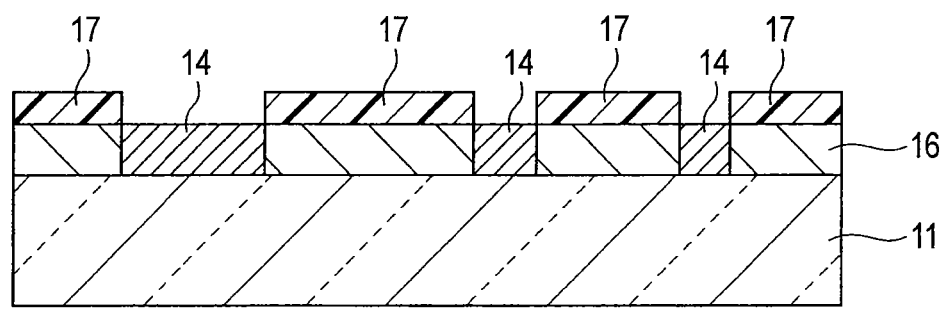

Metal on the surfaces of the metal nanowires in an exposed region 18 of the three-dimensional network 16 is reacted to form reaction products, thereby forming the first conductive region 14 as shown in FIG. 3C. The reaction in the process may be sulfuration, oxidation or halogenation. For example, a predetermined reactive gas may be reacted with the three-dimensional network of metal nanowires in a gaseous phase.

Ozone gas is preferred to obtain oxides. The reaction rate is increased by reacting with ozone gas while irradiating with UV light. Halogen gas alone or hydrogen halide gas may be used to obtain a halide. Particularly, chlorine gas is preferred. When the material of the metal nanowires is silver, the metal nanowires can be reacted by sulfuration. Sulfur vapor and hydrogen sulfide gas can be used to obtain sulfides.

The first conductive region 14 has a conductivity lower than that of the second conductive region 13. The difference can be suitably selected depending on the target device or the like. For example, when the surface resistance of the second conductive region is from about 5 to $100\Omega/\square$, the surface resistance of the first conductive region may be from about 10 to $10^7 \Omega/\square$.

Since the surface resistance is increased as the reaction of the metal nanowires progresses, the nanowires may be reacted while controlling so as to be a desired surface resistance. When appropriate conditions to obtain a desired surface resistance are examined by, for example, performing a preliminary experiment, the reaction may be performed under the conditions. Alternatively, the reaction of the metal nanowires can be controlled by measuring transmission spectra.

As described above, in the three-dimensional network 16, the metal nanowires in the exposed region are reacted to form the first conductive region 14 with low conductivity. On the other hand, the inherent high conductivity is maintained in a region covered with the protective film 17 and the region becomes the second conductive region 13. A buffer zone with a predetermined width may be present between the first conductive region 14 and the second conductive region 13. The width of the buffer zone varies depending on the formation method of the protective film. For example, when the protective film is formed by screen printing, the width of the buffer zone is from about 5 to 50 µm. When the protective film is formed by photolithography, the width of the buffer zone is from about 0.5 to 3 µm.

The patterned electrode layer 12 as shown in FIG. 1 which includes the first conductive region 14 and the second conductive region 13 is formed by removing the protective film 17. The protective film 17 can be removed with an appropriate solvent according to the material. For example, a protective film formed of PMMA can be removed with ethyl acetate, acetone or the like, while a protective film formed of a cured layer of a positive photosensitive resist can be removed with release agents provided by manufacturers (mostly various kinds of mixed solvents).

The second conductive region 13 in the electrode layer 12 is required to maintain the optical transparency and conductivity. When the metal nanowires 21 included in the second conductive region 13 are reacted by oxidation, it becomes difficult to maintain desired characteristics. Such a disadvantage can be avoided by forming the reaction inhibiting layer outside of the electrode layer 12. The reaction inhibiting layer may be a silicon oxide film formed by, for example, a spattering method, a sol gel method or the like.

The transparent electrode laminate according to this embodiment is patterned by increasing the surface resistance in a predetermined region of the three-dimensional network of metal nanowires. The transparent electrode laminate according to this embodiment is excellent in flatness as a whole, and no difference in height of the pattern is caused. Since defects due to a difference in height of the pattern are reduced, the transparent electrode laminate of this embodiment can be suitably used for an ultra thin film device such as an organic EL device.

Hereinafter, specific examples of the transparent electrode laminate will be shown.

Example 1

A 0.4 mm-thick glass substrate is used as the transparent substrate 11. As a raw material of the electrode layer 12, a methanol dispersion liquid containing silver nanowires with an average diameter of 115 nm is used. The concentration of the silver nanowires in the dispersion liquid is about 0.3% by mass. Silver nanowires with an average diameter of 115 nm, manufactured by Seashell Technology, are used.

The surface hydrophilicity of the glass substrate is improved by performing a nitrogen plasma treatment. Specifically, the nitrogen plasma treatment is performed by leaving the substrate in a nitrogen plasma (0.1 millibar) for 10 minutes using a magnetron sputtering device (13.56 MHz, 150 W). Drops of the dispersion liquid containing silver nanowires is put on the treated glass substrate and they are naturally diffused to form a coating film.

Methanol as a dispersion medium is removed from the coating film by drying in an argon flow at 60° C. for 1 hour, and a three-dimensional network of silver nanowires is obtained. The surface resistance measured by the four-point probe method is about 5 Ω/□.

A protective film solution is obtained by dissolving polymethylmethacrylate (PMMA) in ethyl acetate to prepare 10% by mass of a solution. The protective film solution is applied to the three-dimensional network by screen-printing and dried to obtain a patterned protective film. The screen used for printing is a metal mesh screen, and the coated film is dried in an oven at 90° C.

A PMMA film with a width of 2 mm and a height of 10 µm is placed on the three-dimensional network of silver nanowires at a predetermined interval of 5 mm.

The glass substrate having the three-dimensional network in which a predetermined region is exposed is put in a glass container. In the air at 80° C., the silver nanowires in the exposed region of the three-dimensional network are reacted with sulfur vapor. The sulfur vapor is produced by heating sulfur powder to 80° C. The silver nanowires in the exposed region of the three-dimensional network are sulfurated to form silver sulfide, and thus the surface resistance in the region is increased. The reaction time to be subjected to sulfur vapor and the surface resistance in the exposed region after the reaction are summarized in Table 1 below.

TABLE 1

| Reaction time (min) | Surface resistance (Ω/□) |
|---|---|
| 0 | 5 |
| 3 | 5 |
| 11 | 7 |
| 18 | 8 |
| 27 | 32 |
| 35 | 100 |
| 43 | 170 |
| 51 | $1 \times 10^7$ |

As shown in Table 1 above, the surface resistance in the exposed region is gradually increased after an induction period (about 10 minutes) and it is rapidly increased in 50 minutes. The electrode made of silver nanowires is gradually blackened after the induction period, and the reaction itself is gradually progressed.

The silver nanowires in the exposed region of the three-dimensional network are reacted with sulfur vapor for 1 hour, followed by removal of the protective film with acetone. The whole three-dimensional network is protected with a Teflon (registered trademark) sheet, followed by pressing with a flat stainless steel plate under a pressure of 200 kg weight/cm$^2$ to obtain the transparent electrode laminate of this example. The surface resistance in the region where the reaction is generated is $1 \times 10^7$ Ω/□ or more and a first conductive region with low conductivity is formed. The width of the first conductive region is about 3 mm. On the other hand, the surface resistance in the region protected by PMMA is unchanged from the initial stage and it is 5 Ω/□. The protected region becomes a second conductive region with high conductivity. The width of the second conductive region is about 2 mm.

As a result of the SEM observation, in the electrode layer of the transparent electrode laminate of this example, a buffer zone with a width of about 6 to 10 µm is present between the first conductive region 14 and the second conductive region 13. When measured with an AFM, a difference in average height between the first conductive region and the second conductive region is 20 nm or less.

Example 2

As a raw material of the electrode layer 12, a methanol dispersion liquid containing silver nanowires with an average diameter of 60 nm (manufactured by Seashell Technology) is used. The concentration of the silver nanowires in the dispersion liquid is about 0.3% by mass.

As the transparent substrate 11, the same glass substrate as that of Example 1 is used, and the surface is treated with 3-aminoethyl triethoxysilane. The dispersion liquid containing silver nanowires is applied onto the treated glass substrate with a bar coater to form a three-dimensional network of silver nanowires. The surface resistance measured by the four-point probe method is about 80 Ω/□.

A positive photoresist for spin coating (manufactured by AZ Electronic Materials Ltd.) as the protective film material is applied to the whole surface of the three-dimensional network by spin coating. Pattern exposure is performed by irradiating the surface with UV light through a predetermined exposure mask. Thereafter, an unexposed portion is dissolved with a developer and removed to form a resist pattern. The resist pattern with a width of 200 µm and a height of 50 µm is placed on the three-dimensional network of silver nanowires at a predetermined interval (3 mm).

The silver nanowires in the exposed region of the three-dimensional network are reacted with sulfur vapor in the same procedure as described in Example 1. The silver nanowires in the exposed region of the three-dimensional network are sulfurated to form silver sulfide, and thus the surface resistance in the region is increased. The reaction time to be subjected to sulfur vapor and the surface resistance in the exposed region after the reaction are summarized in Table 2 below.

TABLE 2

| Reaction time (min) | Surface resistance (Ω/□) |
|---|---|
| 0 | 76 |
| 3 | 360 |
| 6 | $4 \times 10^6$ |

As shown in Table 2 above, the surface resistance in the exposed region is rapidly increased in about 5 minutes. A difference with the case of Example 1 is assumed due to the fact that the surface area is large since the diameter of silver nanowires is small and the reaction rate with sulfur vapor is increased.

The silver nanowires in the exposed region of the three-dimensional network are reacted with sulfur vapor for 10 minutes, followed by removal of the protective film with acetone. The whole three-dimensional network is protected with a Teflon (registered trademark) sheet, followed by pressing with a flat stainless steel plate under a pressure of 200 kg weight/cm$^2$ to obtain the transparent electrode laminate of this example. The surface resistance in the region where the reaction is generated is $1 \times 10^7$ Ω/□ or more and a first conductive region with low conductivity is formed. The width of the first conductive region is about 200 µm. On the other hand, the surface resistance in the region protected by the resist pattern is unchanged from the initial stage and it is 80 Ω/□. The protected region becomes a second conductive region with high conductivity. The width of the second conductive region is about 3 mm.

As a result of the SEM observation, in the electrode layer of the transparent electrode laminate of this example, a buffer zone with a width of about 1 µm is present between the first conductive region 14 and the second conductive region 13. When measured with an AFM, a difference in average height between the first conductive region and the second conductive region is 15 nm or less.

Example 3

The hydrophilicity of the surface of a glass substrate is improved in the same procedure as described in Example 1. A three-dimensional network of silver nanowires is formed on the surface in the same procedure as described in Example 2. A protective film formed of a PMMA cured layer is formed in a predetermined region on the three-dimensional network of silver nanowires in the same procedure as described in Example 1.

The glass substrate having the three-dimensional network in which a predetermined region is exposed is put in a glass container at room temperature. The silver nanowires in the exposed region of the three-dimensional network are reacted with argon gas containing 3% of chlorine gas which has been adjusted by the manufacturer. The silver nanowires in the exposed region of the three-dimensional network are salified to form silver chloride, and thus the surface resistance in the region is increased.

The silver nanowires in the exposed region of the three-dimensional network are reacted with chlorine gas for 20 minutes, followed by removal of the protective film with acetone. The whole three-dimensional network is protected with a Teflon (registered trademark) sheet, followed by pressing with a flat stainless steel plate under a pressure of 200 kg weight/cm$^2$ to obtain the transparent electrode laminate of this example. The surface resistance in the region where the reaction is generated is $1\times10^7\Omega/\square$ or more and a first conductive region with low conductivity is formed. The width of the first conductive region is about 3 mm. On the other hand, the surface resistance in the region protected by PMMA is unchanged from the initial stage and it is $70\Omega/\square$. The protected region becomes a second conductive region with high conductivity. The width of the second conductive region is about 2 mm.

As a result of the SEM observation, in the electrode layer of the transparent electrode laminate of this example, a buffer zone with a width of about 5 μm is present between the first conductive region 14 and the second conductive region 13. When measured with an AFM, a difference in average height between the first conductive region and the second conductive region is 15 nm or less.

Example 4

As a raw material of the electrode layer 12, a methanol dispersion liquid containing copper nanowires with an average diameter of 90 nm is used. The concentration of the copper nanowires in the dispersion liquid is about 0.2% by mass. The copper nanowire is produced based on JP 2004-263318 (KOKAI).

The hydrophilicity of the surface of the quartz substrate is improved in the same procedure as described in Example 1, and the dispersion liquid containing copper nanowires is dropwise applied onto the surface. A three-dimensional network of copper nanowires is formed by drying in an argon flow at 60° C. for 1 hour.

A protective film formed of a PMMA cured layer is formed in a predetermined region on the three-dimensional network of copper nanowires in the same procedure as described in Example 1. The copper nanowires in the exposed region of the three-dimensional network are reacted with chlorine gas in the same procedure as described in Example 3. As a result, the copper nanowires in the exposed region of the three-dimensional network are salified to form copper chloride, and thus the surface resistance in the region is increased.

The copper nanowires in the exposed region of the three-dimensional network are reacted with chlorine gas for 20 minutes, followed by removal of the protective film with acetone. The whole three-dimensional network is protected with a Teflon (registered trademark) sheet, followed by pressing with a flat stainless steel plate under a pressure of 200 kg weight/cm$^2$ to obtain the transparent electrode laminate of this example. The surface resistance in the region where the reaction is generated is $1\times10^7\Omega/\square$ or more and a first conductive region with low conductivity is formed. The width of the first conductive region is about 3 mm. On the other hand, the surface resistance in the region protected by PMMA is unchanged from the initial stage and it is $20\Omega/\square$. The protected region becomes a second conductive region with high conductivity. The width of the second conductive region is about 2 mm.

As a result of the SEM observation, in the electrode layer of the transparent electrode laminate of this example, a buffer zone with a width of about 5 μm is present between the first conductive region 14 and the second conductive region 13. When measured with an AFM, a difference in average height between the first conductive region and the second conductive region is 20 nm or less.

Example 5

A patterned electrode layer having a three-dimensional network of silver nanowires is formed on a glass substrate in the same procedure as described in Example 1.

Subsequently, Cu foil is used as an underlayer catalyst layer and a flat and single-layered graphene substituted by nitrogen is produced by a CVD method.

The CVD method is performed at 1000° C. for 5 minutes using a mixed gas of ammonia, methane, hydrogen, and argon (15:60:65:200 ccm) as a reaction gas. Most of the graphene to be obtained is a single-layered graphene, and a two- or multi-layered graphene is partially produced depending on the conditions.

Further, the graphene is treated in a mixed flow of ammonia and argon (15:200 ccm) at 1000° C. for 5 minutes, followed by cooling in an argon flow. The Cu foil surface is previously annealed by performing a heat-treatment by laser radiation to increase the crystal grain size. As a result, the size of the graphene domain to be obtained becomes larger, and the conductivity is improved. A PET film having a thickness of 150 μm in which the surface as a transfer film is coated with silicone resin is pressure-bonded to the single-layered graphene. Then, Cu constituting the underlayer catalyst layer is dissolved to transfer the single-layered graphene to a transfer film. In order to dissolve Cu, it is immersed in an ammonia alkaline copper chloride etchant. The same operation is repeated, thereby laminating the four-layered graphene onto the transfer film.

The doping amount (N/C atomic ratio) of nitrogen in graphene can be estimated by the X-ray photoelectron spectroscopy (XPS). In the graphene obtained in the process, the doping amount of nitrogen is from 1 to 2 atm %.

The graphene film thus formed on the transfer film is transferred onto the electrode layer having a three-dimensional network of silver nanowires. Specifically, the transfer of the graphene layer onto the electrode layer is performed by pressing the graphene film on the transfer film onto the electrode of silver nanowires at 80° C. and peeling off the transfer film. As a result of measurement with an atomic force microscope (AFM), the irregularity of the surface of the graphene film is 20 nm or less and is excellent in flatness. There are less defects such as peeling-off of the film in the boundary between the first conductive region and the second conductive region.

Comparative Example 1

The same methanol dispersion liquid containing silver nanowires as Example 1 is off-set printed on the glass substrate whose surface is subjected to a hydrophilization treatment in the same procedure as described in Example 1. An electrode layer formed of a pattern of silver nanowires is formed by drying in an argon flow at 60° C. for 1 hour. The width of the pattern to be obtained is about 2 mm and the height is about 200 nm. The graphene film is transferred onto the electrode layer in the same procedure as described in Example 5, and the transparent electrode laminate of this comparative example is obtained.

As a result of observation with an AFM, many defects such as peeling-off of the graphene film are present in the region at the end of the pattern of silver nanowires.

Example 6

Figure 4:
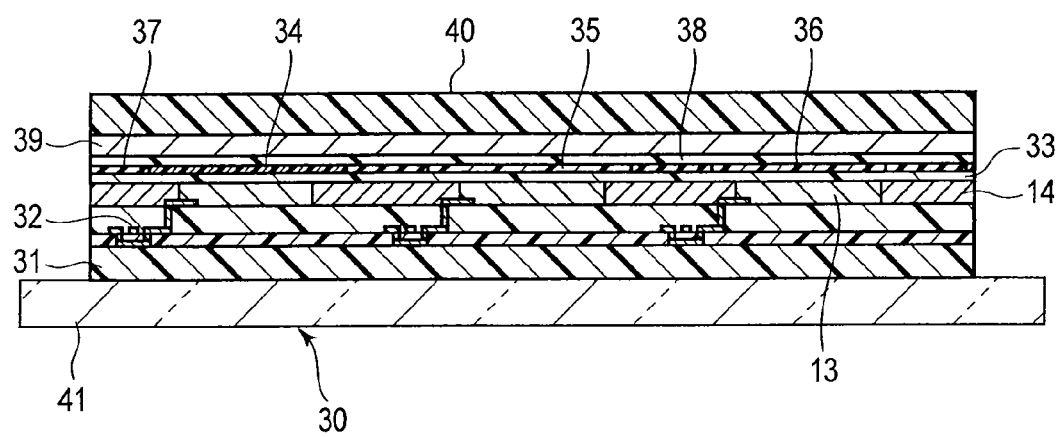
FIG. 4 is a schematic view showing a cross-sectional structure of an organic EL device formed by using a transparent electrode laminate according to one embodiment.

The transparent electrode laminate of Example 2 is applied to produce an organic EL device 30 shown in FIG. 4.

In the organic EL device 30 to be illustrated, a transparent polyimide substrate 31 in which a plurality of TFTs 32 are produced is formed on a glass substrate 41. The TFTs 32 are electrically connected to transparent electrodes formed thereon. The transparent electrode herein is configured to have a high conductivity region 13 in an electrode layer formed in the same procedure as described in Example 2.

A plurality of high conductivity regions 13 as the transparent electrode are adjacent to one another via low conductivity regions 14, and a hole injection layer 33 is formed on the electrode layer including these regions. The hole injection layer 33 may be configured to have a composite film containing poly(3,4-ethylenedioxythiophene)/poly(styrenesulfonate) (PEDOT-PSS) which is formed by a spin coating method. The thickness is about 30 nm.

Emission layers 34, 35, and 36 isolated by an isolating layer 37 are formed so as to correspond to each of the transparent electrodes. The thickness of the emission layers is usually from about 20 to 50 nm. The isolating layer 37 is formed by vapor-depositing insulating molecules. Each of the emission layers is formed by mask-depositing emissive molecules corresponding to pixels of RGB. An electronic injection layer 38 formed of a deposition layer of lithium fluoride and an aluminum electrode 39 are sequentially laminated on the emission layers and the isolating layer. Such a lamination layer structure is laminated and sealed with a polyimide film 40 having an antioxidant film of aluminium.

Since the structure includes the transparent electrode laminate of Example 2 as a patterned transparent electrode, no influence of a difference in height due to pattern is caused. Therefore, the organic EL device 30 of this example has less defects in pixel and has good emission characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transparent electrode laminate comprising:
a transparent substrate; and
an electrode layer which is formed on the transparent substrate and comprises a three-dimensional network of metal nanowires, the electrode layer comprising a first conductive region and a second conductive region adjacent to the first conductive region, surfaces of the metal nanowires in the first conductive region being reacted to form reaction products, the reaction products being selected from a group consisting of sulfides of silver and halides, surfaces of the metal nanowires in the second conductive region being unreacted, the second region having conductivity higher than that of the first conductive region and an optical transparency, there being a difference in average height between the first conductive region and the second conductive region;
wherein the laminate further comprises a buffer zone between the first conductive region and the second conductive region, the metal nanowires in the buffer zone having reaction products at an amount smaller than that of the first conductive region, the buffer zone reducing precipitous changes in a film thickness.

2. The laminate according to claim 1, wherein a diameter of the metal nanowires is from 20 to 200 nm.

3. The laminate according to claim 2, wherein a diameter of the metal nanowires is from 60 to 150 nm.

4. The laminate according to claim 1, wherein an average length of the metal nanowires is from 1 to 100 μm.

5. The laminate according to claim 1, wherein a ratio of a length and diameter (length/diameter) of the metal nanowires is from 100 to 1000.

6. The laminate according to claim 1, wherein a thickness of the electrode layer is from 30 to 300 nm.

7. The laminate according to claim 1, wherein the metal nanowires are made from silver or a silver alloy, and the reaction products are selected from sulfides and halides.

8. The laminate according to claim 7, wherein the silver alloy comprises at least one selected from the group consisting of palladium, indium, gold, bismuth, and copper.

9. The laminate according to claim 1, wherein the metal nanowires are made from copper or a copper alloy, and the reaction products are halides.

10. The laminate according to claim 9, wherein the copper alloy comprises at least one selected from the group consisting of gold, silver, zinc, nickel, and aluminum.

11. The laminate according to claim 1, wherein the electrode layer further comprises a carbon layer which comprises a graphene and formed on at least one of surfaces of the three-dimensional network of metal nanowires.

12. The laminate according to claim 11, wherein a part of carbons in the graphene is substituted by nitrogen.

13. The laminate according to claim 12, wherein an atom ratio of the nitrogen and the carbon in the graphene (N/C) is from 1/200 to 1/10.

14. The laminate according to claim 1, further comprising a reaction inhibiting layer formed on the electrode layer.

15. The laminate according to claim 1, wherein the transparent substrate is a glass substrate having a thickness of 0.1 to 5 mm.

16. The laminate according to claim 1, wherein the transparent substrate is an organic material substrate having a thickness of 0.1 to 10 mm.

* * * * *